United States Patent
Chen et al.

(10) Patent No.: US 6,266,275 B1
(45) Date of Patent: Jul. 24, 2001

(54) DUAL SOURCE SIDE POLYSILICON SELECT GATE STRUCTURE AND PROGRAMMING METHOD UTILIZING SINGLE TUNNEL OXIDE FOR NAND ARRAY FLASH MEMORY

(75) Inventors: Paul-Ling Chen, Saratoga; Mike Van Buskirk; Shane Charles Hollmer, both of San Jose; Binh Quang Le, Santa Clara; Shoichi Kawamura; Chung-You Hu, both of Sunnyvale; Yu Sun, Saratoga; Sameer Haddad, San Jose; Chi Chang, Redwood City, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/410,512

(22) Filed: Sep. 30, 1999

Related U.S. Application Data

(62) Division of application No. 09/063,688, filed on Apr. 21, 1998, now Pat. No. 5,999,452, which is a division of application No. 08/940,674, filed on Sep. 30, 1997, now Pat. No. 5,912,489, application No. 09/410,512, which is a continuation-in-part of application No. 08/668,632, filed on Jun. 19, 1996, now Pat. No. 5,793,677.

(51) Int. Cl.$^7$ ............................................. G11C 7/00
(52) U.S. Cl. ..................... 365/185.18; 365/185.17; 365/185.05; 365/185.01; 365/185.14
(58) Field of Search .................. 365/185.01, 185.02, 365/185.05, 185.14, 185.18, 185.17

(56) References Cited

U.S. PATENT DOCUMENTS

| | | | |
|---|---|---|---|
| 5,621,684 | * | 4/1997 | Fung ................................ 365/185.17 |
| 5,671,176 | * | 9/1997 | Jang et al. ....................... 365/185.02 |
| 5,732,018 | * | 3/1998 | Choi et al. ....................... 365/185.17 |
| 5,812,454 | * | 9/1998 | Choi ................................. 365/185.17 |
| 5,912,489 | * | 6/1999 | Chen et al. ........................... 257/321 |
| 5,936,887 | * | 8/1999 | Choi et al. ....................... 365/185.17 |
| 5,936,890 | * | 8/1999 | Yeom ............................... 365/185.22 |
| 5,999,452 | * | 12/1999 | Chen et al. ...................... 365/185.17 |

\* cited by examiner

Primary Examiner—Viet Q. Nguyen
(74) Attorney, Agent, or Firm—Fliesler Dubb Meyer & Lovejoy LLP

(57) ABSTRACT

A series select transistor and a source select transistor are connected in series at the end of a NAND string of floating gate data storage transistors. The floating gates, the series select gate, and the source select gate are all preferably formed of polysilicon. The same tunnel oxide layer is used as gate oxide for the series select transistor and source select transistor as well as for the floating gate data storage transistors. Two layers of polysilicon in the series select gate and the source select gates are tied together. The series select transistor is tied to the last transistor in the NAND string. The source select transistor is tied to the array Vss supply. In order to program inhibit a specific NAND cell during the programming of another NAND cell, the gate of the series select transistor is raised to Vcc, while the gate of the source select transistor is held to ground. The two transistors in series are able to withstand a much higher voltage at the end of the NAND string without causing gated-diode junction or oxide breakdown in either the series or the source select transistor.

8 Claims, 5 Drawing Sheets

DUAL SOURCE SIDE POLYSILICON SELECT GATE STRUCTURE AND PROGRAMMING METHOD UTILIZING SINGLE TUNNEL OXIDE FOR NAND ARRAY FLASH MEMORY

CROSS-REFERENCE TO RELATED APPLICATION

This application is a divisional of Ser. No. 09/063,688, U.S. Pat. No. 5,999,452 filed Apr. 21, 1998, which is a divisional of Ser. No. 08/940,674 U.S. Pat. No. 5,912,489, Issued Jun. 15, 1999.

The present application is a continuation-in-part application of U.S. patent application, Ser. No. 8/668,632, filed Jun. 19, 1996, now U.S. Pat. No. 5,793,677 entitled, "Using Floating Gate Devices As Select Gate Devices for NAND Flash Memory and Its Bias Scheme", the disclosure of which is hereby incorporated herein by reference in its entirety.

BACKGROUND OF THE INVENTION

1. Field of the Invention

The present invention relates to the field of programmable non-volatile memory. Specifically, the present invention relates to the field of NAND-type floating gate flash memory cells which are programmed and erased using a high programming voltage.

2. Discussion of the Related Art

FIG. 1 illustrates a conventional NAND-type flash memory cell 100 suitable for use in the memory array. In the cell 100, sixteen floating gate storage transistors 101–104 are connected in series to a bit line 105 which is used for reading and programming individual storage transistors within the cell. Each storage transistor 101–104 is equipped with a polysilicon floating gate 105–108. The polysilicon floating gates 105–108 are "floating" in the sense that they are electrically isolated under normal conditions since they are surrounded by insulating layers, typically silicon dioxide, on all sides.

Specifically, each floating gate 105–108 is separated by its corresponding channel by a silicon dioxide layer 109–112. The energy differential between the conduction band and the valence band in silicon is approximately 1.1 eV (electron-Volts). However, the energy differential between the conduction and the valence band in silicon dioxide is approximately 9 eV. Silicon dioxide's relatively large energy differential between the conduction band and the valence band is precisely the reason that silicon dioxide is generally non-conductive and is generally a very good insulator. An electron in an atomic or molecular orbit, thus within the valence band, must gain 9 eV of energy to break free of its orbit and enter the conduction band as a free charge carrier. When silicon and silicon-dioxide are joined, the conduction band of silicon dioxide is approximately 3.25 eV above the conduction band of silicon. Because an average electron possesses a thermal energy of only approximately 0.025 eV at room temperature, and because the variation in energy for individual electrons is not sufficiently high, the probability of an electron in the conduction band of silicon gaining enough energy to enter the conduction band in silicon dioxide is infinitesimally small. Although the 3.25 eV conduction band barrier always exists at a silicon to silicon-dioxide junction, the energy levels of electrons above and below the junction are directly affected by the potential gradient created by an electric field.

For example, a polysilicon gate overlies a silicon dioxide insulation layer which itself overlies a silicon transistor device channel. When a vertical electric field is applied in the silicon dioxide by raising the voltage of the polysilicon gate, the conduction band electrons in the silicon dioxide at some vertical distance above the channel to silicon dioxide junction will possess the same energy as the conduction band electrons in the underlying channel. As the strength of the field increases, the vertical distance decreases between the channel-oxide junction and the point at which silicon dioxide conduction band electrons possess only the same energy as silicon conduction band electrons. When this vertical distance becomes small enough due to a large enough electric field, a significant finite probability exists that an electron in the conduction band of the silicon channel will vertically "tunnel" from the channel to the conduction band of the oxide above the channel-oxide junction. After vertically tunneling into the conduction band of the oxide, the electron can proceed into the conduction band of the gate. The above-described electron tunneling phenomenon is called Fowler/Nordheim tunneling.

During programming of one of the storage transistors of the flash memory cell 100, Fowler/Nordheim tunneling is used to tunnel electrons to one of the floating gates 105–108 from the corresponding device channel. During an erase operation, Fowler/Nordheim tunneling is used to tunnel electrons off the floating gates 105–108 and into the corresponding device channels 109–112. The strength of an electric field is generally the voltage differential per unit distance. Therefore, in order to generate electric fields large enough for tunneling to occur without requiring excessively high voltages, the tunnel oxide 109–112 must be very thin.

FIG. 1 illustrates two NAND-type flash memory cells which share the same word lines wL0–wL15 and select lines SG1 and SG2. A flash memory array may be organized such that bit lines run vertically and are shared amongst a large number of cells. Word lines and select lines may run horizontally and may be shared by a large number of cells. Selecting one specific word line and one specific bit line uniquely identifies a specific storage transistor within the array. Each unique select line and bit line combination identifies a specific NAND flash memory cell having several storage transistors.

A typical program operation is performed using all bit lines of a selected word that has previously been erased such that all storage transistors included in the word contain ones. A program operation typically involves writing zeros into some of the bit line locations while inhibiting the writing of zeros into the remaining locations in which ones are to be stored.

For example, in the small section of an array illustrated in FIG. 1, the programming of the word corresponding to word line wL1 will be discussed below. In this example, a zero is programmed into storage transistor 102 while a one remains stored in storage transistor 113 within NAND cell 114. To effect this programming pattern the bit line BIT0 105 is driven to zero volts while the bit line BIT1 115 is driven to Vcc. The bit select gate line SG1 is driven to Vcc, while the source select gate line SG2 is driven to ground.

After the bit lines are set up, the word lines wL0–wL15 are driven upward from zero volts. A storage transistor having a positive threshold voltage stores a zero, while a negative threshold voltage is indicative of a one. As the word lines wL0–L15 rise, eventually all storage transistors 101–104 and 118, 113, 119, and 120 are turned on regardless of whether or not a zero or a one is currently stored on any given storage transistor.

Under these conditions, the bit select transistor 116 of the NAND cell 100 to be programmed is turned on and it pulls the sources, drains, and channels of all the storage transistors 101–104 in NAND cell 100 to zero volts. Meanwhile, the bit select transistor 117 of the NAND cell 114 to be program inhibited raises the sources, drains, and channels of all the storage transistors 118, 113, 119, 120 to Vcc−VtSG1, where VtSG1 is the threshold voltage of the bit select gate 117.

The unselected word lines wL0 and wL2 (not shown) through wL15 are driven to about 10 Volts. The selected word line wL1 is driven to the high programming voltage which may be as high as 20 Volts. After the channels of the program inhibited NAND string 114 are driven to Vcc−VtSG1, the bit select transistor 117 turns off, and the sources, drains, and channels of the storage transistors 118, 113, 119, 120 of the program inhibited NAND cell 114 become a series of linked floating nodes. As the voltages on the control gates connected to the word lines wL0–wL15 continue to rise after the bit select transistor 117 has turned off, the capacitive coupling between the control gate, the floating gate, and the channel cause the channel voltage to rise along with the control gate voltage. The capacitive coupling results from the fact that the negative plate, the channel, of the capacitance is electrically isolated when the bit select transistor 117 turns off. Because the voltage across an ideal capacitance with one terminal open circuited cannot change, the raising of voltage of the positive plate also raises the voltage of the negative plate. The control gate is the positive plate of the capacitor, and the channel is the negative plate. Because of the increase in the channel voltage due to the capacitive coupling between the control gate and the channel, even when the control gates are raised to the programming voltage of around 18 Volts and 10 Volts, respectively, the channel voltage increases to about 8 Volts. The net 10 Volt differential between the control gate and the channel of the program inhibited storage transistor do not produce an electric field strength great enough to cause Fowler/Nordheim tunneling to occur; therefore, the charge on the floating gate is not altered by the programming of other cells within the same word.

During the programming of a word, the source select gate control signal SG2 is held at zero volts, thereby keeping the source select gate transistors 121 and 122 turned off. In the cell being programmed, the drain of source select gate transistor 122 is held to zero volts by the source of the storage transistor 104 while the source of source select gate transistor 122 is directly attached to a ground rail. Therefore, the gate and source of the source select transistor within the programmed cell 100 are all connected to ground.

However, the drain of the source select transistor 121 within the program inhibited cell 114 is capacitively coupled up to about 8 volts by the rise in voltage of the word lines wL0–wL15. The source select transistor 121 therefore has a drain-substrate voltage of about 8 volts and a source-gate voltage of about 8 volts. FIG. 2 illustrates the source select transistor 121 of the program inhibited cell 114 after the word lines have been raised to about 10 Volts for the non-selected words and to about 18 Volts for the selected word. The n+ drain region 201 is approximately at 8 Volts potential. FIG. 2 does not illustrate many of the layers of the completed structure, such as the control gate, metal layers, insulators, or contacts, as their inclusion is not essential to understanding the problem at hand. The drain 201 may additionally serve as a source for the storage transistor 120, although this is not shown in FIG. 2. The n+ source 202 is grounded. Similarly, the p− well 203 is held at zero volts.

Because the 8 Volt reverse biasing of P-N junction created by the drain 201 and the p− well 203, a wide depletion region 204 is created within the p− well. There is also a narrower depletion region 205 on the n+ drain side of the reverse biased P-N junction. The n+ depletion region 205 is narrower than the p− depletion region 204 because the doping concentration is higher in the drain 201 than in the channel and well 203. Because the p− well 203 is held to zero volts and the gate 206 of the source select transistor 121 is also held at zero volts, thereby preventing an inversion layer from forming, the voltage of the channel is also essentially zero volts. The voltage drop from 8 Volts to zero volts occurs across the two depletion regions 205 and 204.

In a reverse biased P-N junction, as the magnitude of the reverse bias increases, the electric field in the depletion regions increases. At some point the electric field becomes so strong that a rapid increase in the current occurs, resulting in junction breakdown. This reverse-biased P-N junction breakdown may be by either of two mechanisms. The first, Zener breakdown, occurs in heavily doped junctions in which the depletion regions are relatively narrow and the electric fields are very high due to the small distance over which the voltage drop occurs. The electric field becomes so large that electrons are pulled from their bonds, thereby creating an electron-hole pair of charge carriers which can carry a large current. The second mechanism, avalanche breakdown, occurs when the few carriers crossing the depletion region in reverse bias gain high energy through acceleration by the field. When and if such a high energy electron collides with an electron in a bond, it knocks the electron loose. The hole and electron created by the collision are each accelerated in opposite directions by the field and eventually knock two more pairs loose. The resulting avalanche of carriers results in a very large current.

The point 207 near the surface of the channel and near the P-N channel-drain junction within the P-depletion region is illustrated in FIG. 3. The existence of the 8 Volt potential between the drain 201 and the channel results in a lateral electrical field Eh 302 within the depletion regions 205 and 204. The peak electric field is typically found at the junction itself. However, in the case of a MOS transistor, a vertical field component Ev 301 results from the voltage drop across the n+ drain 205 to the overlying gate 206. The magnitude of the vertical field Ev 301 is a function of the voltage at point 207 and the thickness of the gate oxide layer 128. Specifically, the vertical field Ev is roughly proportional to the voltage at point 207 divided by the gate oxide 128 thickness. Therefore, a thinner gate oxide 128 will result in a proportionately higher vertical field component Ev 301 for a given voltage. The magnitude E 303 of the total electric field is the vector sum of the vertical field Ev 301 and the lateral field Eh 302, as illustrated in FIG. 3.

The source select gate transistors 121 and 122 must be fabricated such that the total field magnitude E 303 within the depletion regions 204 and 205 is below the threshold at which "gated diode", junction breakdown occurs. For a given drain voltage and doping profile, this maximum electric field constraint mandates a minimum thickness for the gate oxide 128. If the gate oxide 128 is thinner than the minimum thickness, the vertical electric field component Ev 301 and total electric field E 303 will be large enough to cause gated diode junction breakdown between the drain and channel. The resulting breakdown current will flow through to the source 202 and the substrate through the p− well 203, resulting in the discharge of the channels of the program inhibited storage transistors 118, 113, 119, and 120, and creating a high enough field for Fowler/Nordheim tunneling to alter undesirably the charge on the floating gate of the storage transistor 113 whose control gate was raised to either 18 Volts or 10 Volts by the word line wL1.

As discussed above, the tunnel oxide layers 109–112 and 123–126 between the floating gates and the channels of the storage transistors 101–104, 113, 188–120 must be thin enough to allow high electric fields to result, while the gate oxide layers 127 and 128 in the source select transistors 122 and 121 must be thick enough to prevent junction breakdown from occurring. Unfortunately, any oxide thickness low enough for tunneling to occur in the storage transistors will result in junction breakdown of the source select transistors. Therefore, the conventional NAND flash memory cell requires different oxide thickness for the tunnel oxides and the select gates.

FIG. 2 illustrates the different gate oxide thicknesses which exist in conventional devices. The tunnel oxide layer 126 in data storage transistor 120 is thinner than the gate oxide layer 128 in the source select transistor 121. Some conventional NAND flash memory cells have tunnel oxide thicknesses of about 90 Angstroms in the storage transistors and gate oxide thicknesses of about 180 Angstroms in the select transistors.

Because the oxide thickness in the select gate transistors is greater than the oxide thickness of the floating gate transistors, the oxide breakdown for the select gate transistors is at a higher voltage than for the floating gate transistors.

Unfortunately, to fabricate transistors having different gate oxide thickness on the same wafer requires at least two separate oxide growth cycles separated by a masking step and an etching step. A relatively thick gate oxide layer is grown on the entire substrate from which the source select gates 127 and 128 will be formed. In practice, the gates 129 and 130 of the bit select transistors 116 and 117 will also be formed using the thick oxide. A photoresist mask is deposited to protect the select gate regions 127–130 in the memory array. An etching step is then performed to remove the thick oxide from the non-protected areas of the substrate. After the etching step is performed, the photoresist mask is stripped away from the upper surface of the gate regions 127–130. The thin tunnel oxide is then grown over the entire substrate. Another photoresist mask is deposited to protect the tunnel oxide and the thick gate oxide in the desired regions. Another etching step is performed through the deposited mask, and then the second mask is stripped away.

There are at least two problems with the above described conventional NAND cell. First, the fabrication method requires at least two separate photoresist masks and oxide growth cycles, thus adding process complexity and expense. Secondly, the thick gate oxide quality is compromised by the first photoresist mask. When photoresist is applied over an oxide layer, the photoresist contaminates the surface of the oxide. Even when the oxide is stripped away, the contamination remains on the surface of the oxide. The subsequent oxidation grown over the contaminated oxide creates serious oxide stress and integrity problems, increasing the probability of shearing, nonuniformities in the oxide, and other problems. Thus, the contamination of the oxide due to the first photoresist decreases the usable yield and reliability of the process.

To remove the contamination on the surface of an oxide layer caused by photoresist masking, typically a sacrificial oxide layer is grown and then etched back. However, this is not feasible in the case of the NAND flash memory cell because the initial gate oxide growth is too thin for precise etching of sacrificial oxide back to correct tunnel oxide thickness. If a sacrificial oxide layer were grown and then stripped away over the contaminated gate oxide, either all of the initial gate oxide layer would be undesirably removed from the substrate if the etching of the sacrificial oxide was too deep, or sacrificial oxide would undesirably remain on the entire substrate if the etching of the sacrificial oxide was too shallow. In other words, the imprecision of the etching steps does not allow etching oxide down to the required thickness to within the required tolerance for the NAND cell.

As is apparent from the foregoing discussion, a need exists for a NAND cell design which does not require two separate oxidation and masking steps for the formations of the tunnel oxides and select gate oxides. Furthermore, a need exists for a NAND cell fabrication method which does not have degraded gate oxide in the select transistors.

SUMMARY OF THE INVENTION

Conventional NAND-type flash memory cells required two separate oxidation and masking steps for the is formations of the tunnel oxides and select gate oxides in order to prevent junction breakdown in the select transistors. The result of these two separate oxidation and masking steps is degradation of the tunnel oxide in the floating cells and increased process complexity. Thus, an object of the present invention is to provide a NAND-type flash memory cell which does not require two separate oxidation and masking steps but which nonetheless prevents junction and oxide breakdown from occurring.

According to an embodiment of the present invention, a series select transistor and a source select transistor are connected in series at the end of a NAND string of floating gate data storage transistors. The floating gates, the series select gate, and the source select gate are all preferably formed of polysilicon. The same tunnel oxide layer is used as gate oxide for the series select transistor and source select transistor as well as for the floating gate data storage transistors. The series select transistor is tied to the last transistor in the NAND string. The source select transistor is tied to the array Vss supply.

In order to program inhibit a specific NAND cell according to the present invention during the programming of another NAND cell, the gate of the series select transistor is raised to Vcc, while the gate of the source select transistor is held to ground. The two transistors in series are able to withstand a much higher voltage at the end of the NAND string without causing gated-diode junction breakdown in either the series or the source select transistor.

In order to program inhibit a specific NAND cell according to the present invention during a hot-election programming operation or a Fowler/Nordheim tunnel-erase operation of another NAND cell, the gate of the series select transistor is held to ground, while the gate of the source select transistor is raised to Vcc. When the array Vss connected to the source select transistor's source goes high toward the programming voltage Vpp, the source select transistor will not suffer from gated-diode junction breakdown.

In order to-program a specific NAND cell according to the present invention, the gate of the series select transistor and the source select transistor are each raised to Vcc. This provides a limited conduction path between the array Vss and the NAND string of data storage transistors.

These and other features and advantages of the present invention are more fully explained in the Detailed Description of the Invention as read in conjunction with the Drawings, in which like parts are identified with like reference numerals.

BRIEF DESCRIPTION OF THE DRAWINGS

FIG. 1 schematically illustrates two conventional sixteen word NAND flash memory cells suitable for use in a flash memory array.

FIG. 2 is a cross sectional illustration of a conventional source side select transistor under program inhibiting bias conditions during a programming operation.

FIG. 3 is a cross sectional illustration of the N+/P-drain/channel reverse biased junction of the conventional source side select transistor under program inhibiting bias conditions during a programming operation.

FIG. 4 schematically illustrates two sixteen word NAND flash memory cells according to the present invention suitable for use in a flash memory array.

FIG. 5 is a cross sectional illustration of the series select and source select transistors according to the present invention under program inhibiting bias conditions during a programming operation.

FIG. 6 is a cross sectional illustration of the N+/P-drain/channel reverse biased junction of the source select transistor under program inhibiting bias conditions during a programming operation.

FIG. 7 is a cross sectional illustration of the N+/P-drain/channel reverse biased junction of the series select transistor under program inhibiting bias conditions during a programming operation.

FIG. 8 is a cross sectional illustration of the series select transistor and source select transistor as biased during a program erase Fowler/Nordheim tunnel operation.

The Figures are more fully explained in the Detailed Description of the Invention.

DETAILED DESCRIPTION OF THE INVENTION

Conventional NAND type flash memory cells require a thin tunnel oxide layer between the floating gates and the substrate in order to permit electron tunneling to occur at sufficiently low voltages. These conventional cells also require a thicker gate oxide layer between the select gates and the substrate in order to prevent junction breakdown from occurring during programming. The use of two different oxide thicknesses requires two separate oxide growth cycles, two separate mask formations, and two separate oxide etch steps. These separate steps add to the process complexity and cost. The use of two separate oxide growth steps separated by a mask and etch also decreases the quality of the thick oxide, thereby creating oxide stress problems which compromise the integrity of the circuit.

The present invention allows both select and data storage transistors to be fabricated having the same gate oxide thickness. In contrast to the conventional NAND cells, the gate oxide thickness for the select transistors is the same thickness as the tunnel oxide used in the data storage transistors.

Figure 1:
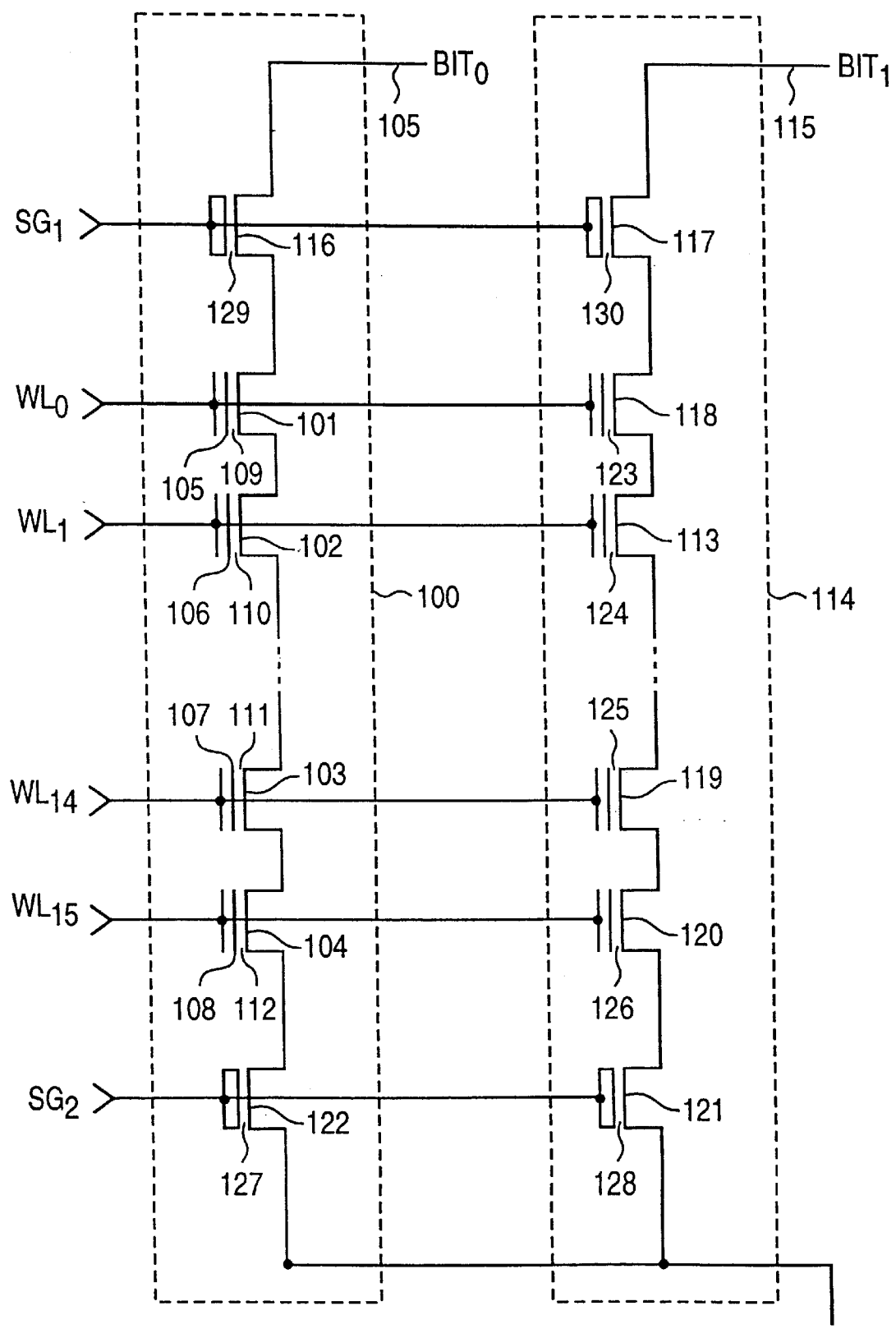
In FIGS. 1 through 8, like parts are identified with like reference numerals.
Figure 2:
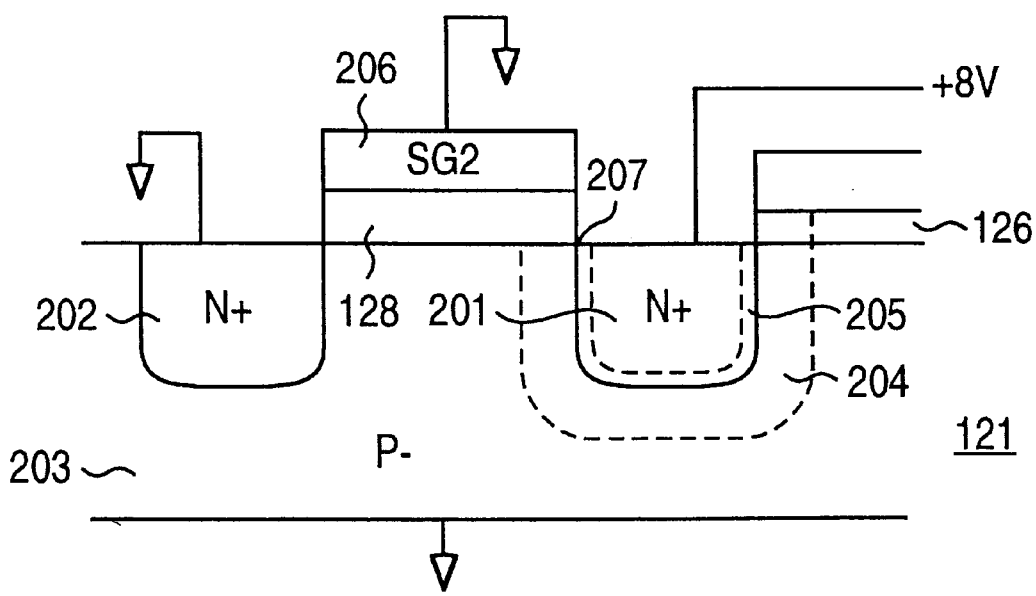
Figure 4:
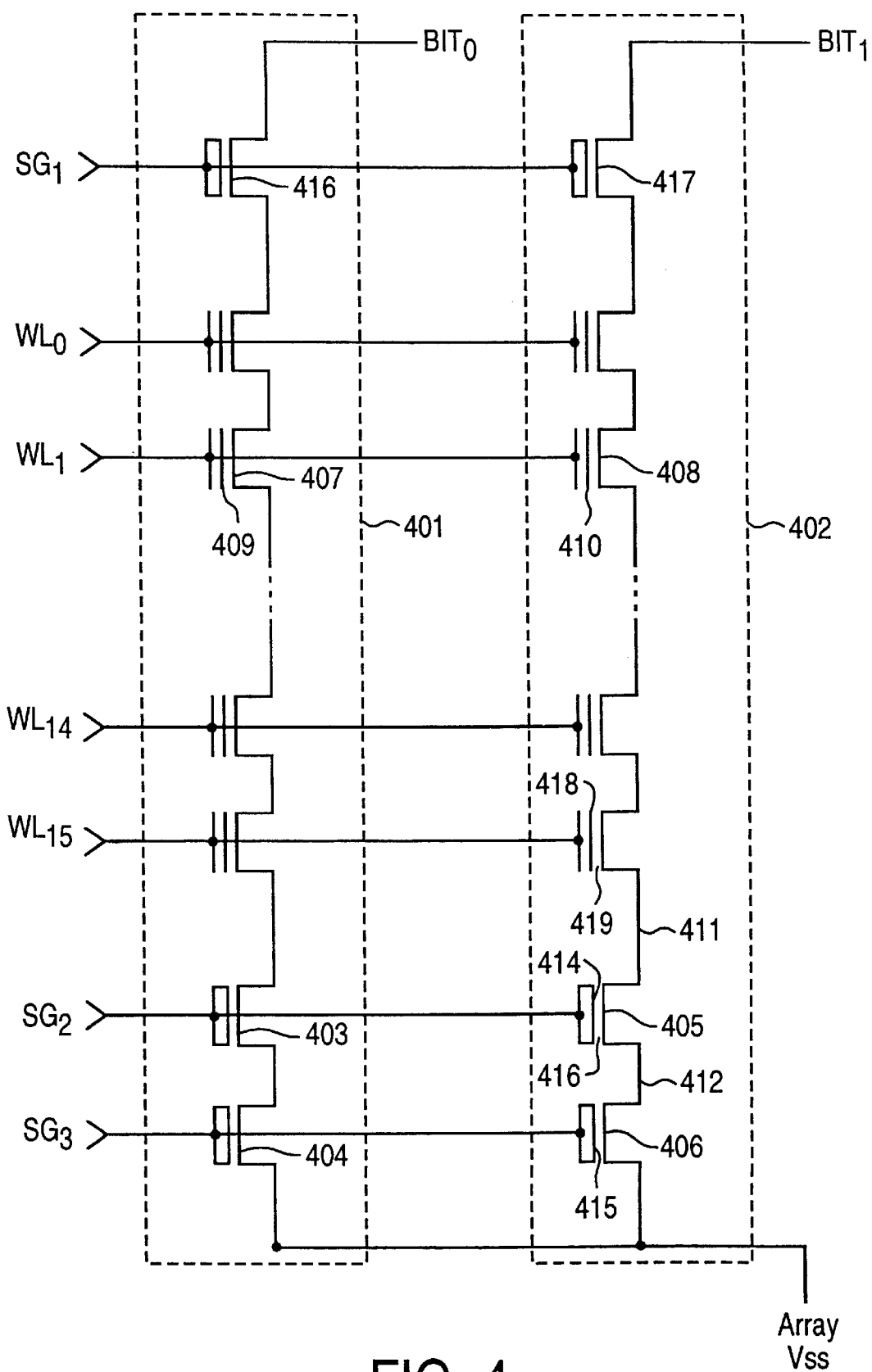

FIG. 4 illustrates two NAND flash memory cells 401 and 402 according to the present invention which share the same word lines wL0–wL15 and the same select lines SG1–SG3. In contrast to the conventional cells (100 and 114 in FIG. 1), the NAND cells 401 and 402 according to the present invention each include two source select transistors (403 & 404 and 405 & 406) in series to connect the data storage transistors in the memory array to the ground power supply.

During the programming of a previously erased word, certain bit locations are programmed so as to store a one, while the remaining bit locations are program inhibited. For example, the data storage transistor 407 within the selected word 401 one location in the NAND cell 401 is programmed with a one while the corresponding data storage transistor 408 in the NAND cell 402 is program inhibited. In order to perform such a programming operation, the bit line BIT0 for the cell 401 to be programmed is lowered to ground, and the bit line BIT1 for the cell 402 to be program inhibited is raised to Vcc. The bit select line SG1 and the series source select lines SG2 are raised to Vcc, and the end source select line SG3 is held at ground. The word lines for the non-selected words are raised to about 10 Volts while the word line for the selected word is raised to about 20 Volts.

Under these conditions, electrons are tunneled onto the floating gate 409 of transistor 407 while no tunneling occurs onto or from the floating gate 410 of the storage transistor 408. The voltage at the drain 411 of the series select transistor 405 is raised to about 8 Volts. Because the series select line SG2 is raised to Vcc (about 3.3 Volts, the series select transistor 405 turns on long enough to raise the voltage at its source 412 to Vcc minus Vth (its threshold voltage). Assuming a 0.8 Volt Vth transistor 405 threshold and a supply voltage Vcc of 3.3 Volts, the voltage at the source 412 of transistor 405 is raised to about 2.5 Volts when the channel of the program inhibited NAND cell is capacitively coupled up to about 8 Volts. The drain to source voltage for series select transistor 405 is thus about 5.5 Volts while its drain to gate voltage is about 4.7 Volts (8V–Vcc).

The voltage at the drain 412 of the source select transistor 406 is also at about 2.5 Volts because it is directly connected to the source of the series select transistor 405. However, the end source select line SG3 is held at ground during a programming operation in order to keep series source select transistors 404 and 406 in cutoff. Therefore, the drain to source voltage for the source select transistor 406 is only about 2.5 Volts, while its drain to gate voltage is also only 2.5 Volts.

Figure 5:
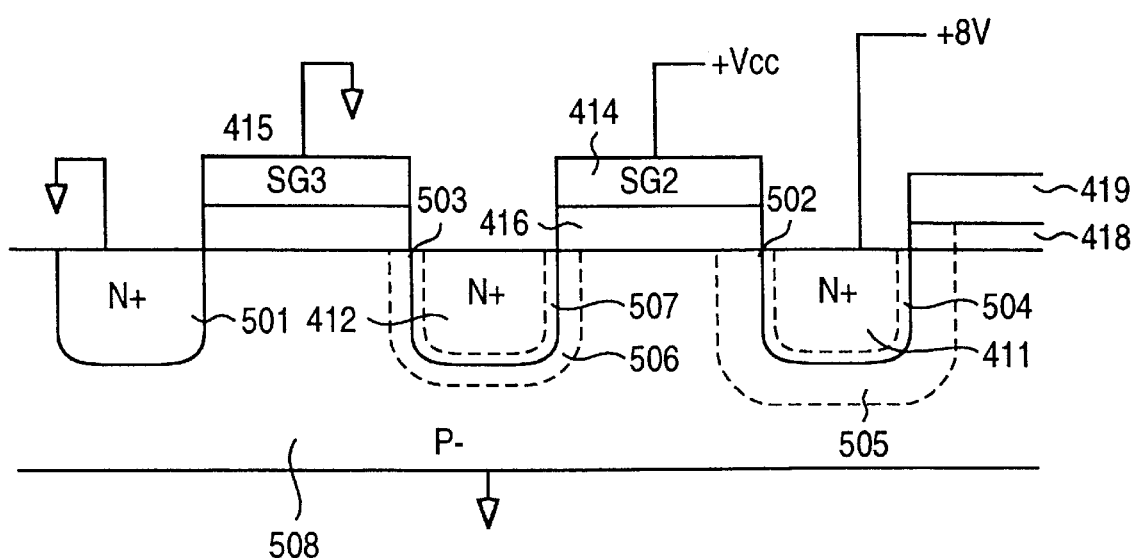

FIG. 5 illustrates the configuration of the series select transistor 405 and the source select transistor 406 in a 16 bit NAND flash cell according to the present invention. The n+ drain region 411 of the series select transistor 405 is capacitively coupled up to about 8 Volts during a programming operation for the program-inhibited NAND cell 402. The gate 414 of the series select transistor 405 is connected to series select line SG2, which is driven to Vcc (3.3 Volts) during the program operation. The n+ region 412 serves as both the drain of the source select transistor 406 and the source of the series select transistor 405. Although there is no requirement that the n+ region 412 be shared by the two select transistors 405 and 406, in the preferred embodiment they are shared to conserve area. According to the present invention, the select transistors 405 and 406 could also be formed with two separate n+ regions connected by an overlying metal layer through contacts or alternatively electrically connected by some other means. The n+ source 501 of the source select transistor 406 is connected to Vss (zero Volts). The gate 415 of the source select transistor 406 is connected to series select line SG3, which is driven to Vss (zero Volts) during the program operation.

The cross-sectional FIG. 5 does not show many of the upper layers of the structure which are not necessary for illustration of the present invention. For example, FIG. 4 shows that the select transistors 403–406, 416 & 417 actually have gates which consist of two layers of polysilicon electrically shorted together. FIG. 5 illustrates only the bottom layers of polysilicon 414 & 415. As another example, the connection of the source 501 to Vss is not shown in FIG. 5, nor is the connection of the drain 411 to the NAND-array.

Furthermore, FIG. 5 illustrates voltages of the various nodes of the program-inhibited NAND cell 402 during a programming operation. This is not meant to imply that these voltages are permanently attached to the various nodes. For example, the n+ drain 411 of the series select transistor 405 in the program inhibited cell 402 is boosted to about 8 Volts during the programming operation; however, at other times the voltage at this node 411 is substantially less than 8 Volts. Similarly, the voltages of the series select gate 414, the source select gate 415, and the source select drain 501 are illustrated during the programming operation, at other times different voltages will be applied by other circuit elements which are not illustrated in FIG. 5 as they are not essential to the present invention.

FIG. 5 further illustrates the depletion regions 504–507 which exist on either side of the reversed biased p−/n+ junctions. Because the p− substrate 508 is tied to Vss (zero volts) while the drain 411 is raised to about 8V during the programming operation, reverse bias is applied to the p−/n+ diode formed by the drain 411 and the channel region of the substrate 508 for the series select transistor 405. Similarly, after the series select transistor 405 has charged the source/drain region 412 to Vcc minus VthSG2 (3.3V–0.8V) (about 2.5V) before cutting off, a reverse bias is thereby applied to the p−/n+ junction formed between the source/drain 412 and the p− substrate 508.

The n+ depletion region 504 is narrower than the p− depletion region 505 because the doping level in the n+ drain 411 is higher than in the p− substrate 508. Similarly, the n+ depletion region 507 is narrower than the p− depletion region 506. The depletion regions 504–505 are significantly wider than the depletion regions 506–507 because the depletion regions 504–505 carry 8 volts of reverse bias while the depletion regions 506–507 carry only a 2.5 volts of reverse bias.

Figure 6:
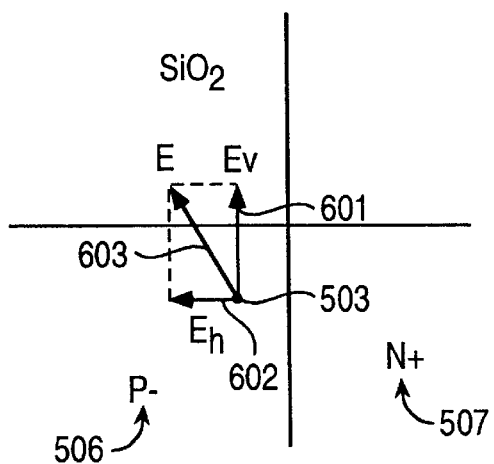

FIG. 6 illustrates the lateral and vertical electric fields which correspond to the point 503 within the p− depletion region 506 in the channel of the source select transistor 406. The vector sum of the vertical electric field Ev 601 and the lateral electric field Eh 602 is the total electric field E 603 at point 503. The lateral electric field Eh 602 is created by the 2.5 Volt potential drop from the drain 412 to the channel of the source select transistor 406. The vertical electric field Ev 601 is created by the 1.8 volt potential drop from the drain 412 to the gate 415 of the source select transistor 415.

Figure 7:
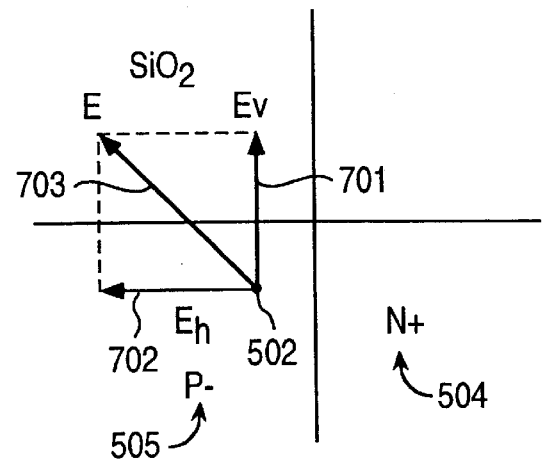

FIG. 7 illustrates the lateral and vertical electric fields which correspond to the point 502 within the p− depletion region 505 in the channel of the series select transistor 405. The lateral electric field Eh 702 at point 502 under the series select gate 414 is stronger than the lateral field Eh 602 at point 503 under the source select gate 415 because the 8V potential drop carried by the junction between drain 411 and the substrate 508 is greater than the 2.5V potential drop carried by the junction between the source/drain 412 and the substrate 508.

Figure 3:
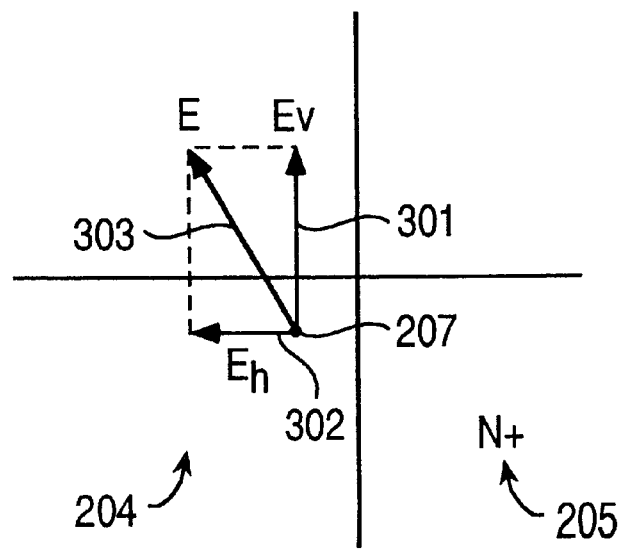

At this point, it is useful to compare the electric fields at point 502 in the device according to the present invention to the electric fields at point 207 in the conventional device. The lateral fields Eh 702 & 302 are equal, because the drain 411 to channel 508 voltage drops are equal (about 8 Volts). However, the circumstances creating the vertical field Ev 701 according to the present invention are different than the circumstances creating the vertical field Ev 301 in the conventional device. In FIG. 7 according to the present invention, the vertical electric field Ev 701 at the point 502 under the series select gate 414 is caused by the 4.7 V potential drop from the drain 411 (about 8 Volts) to the gate 414 (Vcc, about 3.3 Volts). In FIG. 3 in the conventional device, the vertical electric field Ev 301 is caused by the 8 V potential drop from the drain 201 to the gate 206.

Electric field strength has units of volts per unit distance. Thus, the vertical field Ev 701 has a magnitude that is roughly proportional to the drain 411 to gate 414 voltage drop divided by the gate oxide 416 thickness. Because the drain 411 to gate 414 voltage drop is only about 4.7 volts, the gate oxide layer 416 thickness according to the present invention may be reduced by about a factor of 4.7/8.0 (about 0.6) relative to the conventional gate oxide layer 128 thickness while maintaining the same vertical electric field magnitude as in conventional devices. The tunnel oxide to thick select gate oxide thickness ratio is about 90/150 (about 0.6) in a conventional NAND flash device; therefore, the use of tunnel oxide in the select transistors according to the present invention will result in less vertical electric field Ev 701 than the vertical electric field Ev 301 in conventional devices. The total electric field E 703 according to the present invention is therefore lower than the total electric field E 303 in conventional devices. Because the total electric field E 703 is lower according to the present invention than in conventional devices, the risk of gated diode junction breakdown in therefore less than in conventional devices.

More importantly, according to the present invention, thin tunnel oxide is used both under the gates 409–410 of the data storage transistors 407–408 in the NAND string as well as in the select transistors 416–417 & 403–406. FIG. 7 illustrates that the tunnel oxide 418 separating the channel from the floating gate 418 of a data storage transistor is the same thickness as the select gate oxide 416.

By using only one gate oxide thickness, only one oxide growth, one photoresist mask, and one etching process are required to create both the select gate oxides in the select transistors and the tunnel gate oxides in the data storage transistors. This reduces the cost of manufacturing. Moreover, in contrast to the convention device, because no intermediate mask, etch, and strip process is performed, there is no degradation or contamination of the select gate oxide. This eliminates oxide stress and shear problems, thereby increasing the reliability and yield of the process for making the device.

Figure 8:
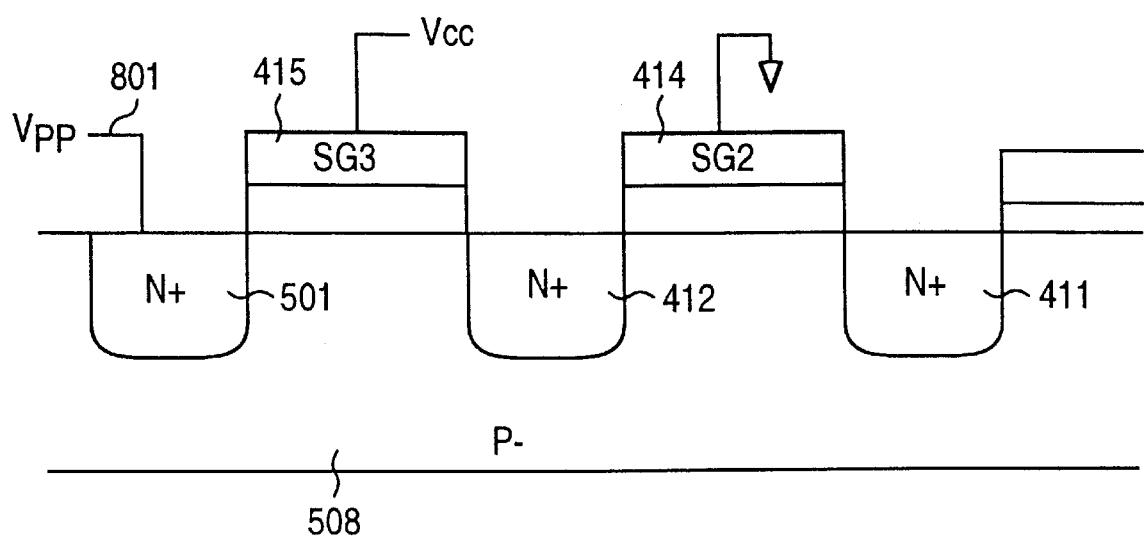

FIG. 8 illustrates how a program-inhibited cell constructed according to the present invention is biased during the hot-electron programming mode and the Fowler/Nordheim tunnel erase mode. The programming voltage Vpp (about 20 Volts) is applied from the array Vss line 801. The source select gate SG3 415 is biased at Vcc while the series select gate SG2 414 is biased at ground.

While the present invention has been described in reference to a specific embodiment, that embodiment is presented by way of example, not by way of limitation. Those skilled in the art will be enabled by this disclosure to add to or to modify the present invention in various obvious ways. Such additions, modifications, and substitutions are deemed to lie within the spirit and scope of the invention as set out in the appended claims.

What is claimed is:

1. A method of program inhibiting a first multiword NAND type floating gate memory cell having a first series select transistor and a first source select transistor during a hot-electron programming operation or a Fowler/Nordheim tunnel-erase operation while programming a second multi-word NAND type floating gate memory cell having a second series select transistor and a second source select transistor, the method comprising the steps of:

provaging a first voltage to a first series select gate of the first series select transistor;

providing a second voltage to a first source select gate of the first source select transistor;

providing a select voltage to a second series select gate of the second series select transistor; and providing the select voltage to a second source select gate of the second source select transistor;

wherein the first voltage is higher than the second voltage.

2. A method as in claim 1,
wherein the first voltage is positive supply voltage.

3. A method as in claim 2,
wherein the second voltage is ground.

4. A method as in claim 3,
wherein the positive supply voltage is about 3.3 Volts.

5. A method as in claim 1,
wherein the select voltage is a positive supply voltage.

6. A method as in claim 1, further comprising the step of:
providing a pass voltage to control gates of unselected storage transistors, wherein the pass voltage is higher than a positive supply voltage.

7. A method as in claim 6, further comprising the step of:
providing a programming voltage to a control gate of a selected storage transistor, wherein the programming voltage is higher than the pass voltage.

8. A method as in claim 7,
wherein the programming voltage is about 20 Volts, and wherein the pass voltage is about 10 Volts.

* * * * *